United States Patent [19]

Michel et al.

[11] 4,275,386

[45] Jun. 23, 1981

[54] BINARY ANALOG-DIGITAL CONVERTER

[75] Inventors: Jean P. Michel, Yerres, France; Claude J. P. F. Le Can, Nijmegen; Marinus C. W. van Buul, Eindhoven, both of Netherlands

[73] Assignee: U.S. Philips Corporation, New York, N.Y.

[21] Appl. No.: 41,042

[22] Filed: May 21, 1979

[30] Foreign Application Priority Data

May 24, 1978 [FR] France .................................. 78 15446

[51] Int. Cl.² .......................................... H03K 13/02
[52] U.S. Cl. ............................................. 340/347 AD
[58] Field of Search ..................... 340/347 AD, 347 M

[56] References Cited

U.S. PATENT DOCUMENTS

| | | | |
|---|---|---|---|
| 2,950,469 | 8/1960 | Raasch | 340/347 AD |
| 3,100,298 | 8/1963 | Fluhr | 340/347 AD |
| 3,225,347 | 12/1965 | Doyle | 340/347 AD |
| 3,255,447 | 6/1966 | Sharples | 340/347 AD |
| 3,276,009 | 9/1966 | Honore | 340/347 AD |
| 3,579,231 | 5/1971 | Bylanski | 340/347 AD |
| 3,930,255 | 12/1975 | Means | 340/347 AD |
| 3,984,832 | 10/1976 | Henry | 340/347 AD |
| 4,072,938 | 2/1978 | Buchanan | 340/347 AD |

Primary Examiner—Charles D. Miller
Attorney, Agent, or Firm—Thomas A. Briody; Robert T. Mayer; James J. Cannon, Jr.

[57] ABSTRACT

An analog-digital converter supplying a digital output signal in natural or reflected binary code, having an input stage, n consecutive conversion stages comprising two parallel channels of identical structure, in each of which there are two current paths in accordance with the result of a comparison of currents effected in the preceding stage and an output stage to which the switched currents proceed. In the complete converter there are $2^n$ current paths corresponding to $2^n$ quantization levels. Conversion is effected by means of a number of stages as small as the number n of bits of the desired digital signal. This converter is simple, fast, asynchronous, has a lower power consumption and its symmetry provides excellent automatic temperature compensation.

14 Claims, 12 Drawing Figures

| | B1 | B2 | B3 | B4 |
|---|---|---|---|---|
| $I_{co} - I_{fo} < 0$ | 0 | 0 | 0 | 0/1 |
| | | | 1 | 0/1 |
| | | 1 | 0 | 0/1 |
| | | | 1 | 0/1 |
| $I_{co} - I_{fo} > 0$ | 1 | 0 | 0 | 0/1 |
| | | | 1 | 0/1 |
| | | 1 | 0 | 0/1 |
| | | | 1 | 0/1 |

| | G1 | G2 | G3 | G4 |
|---|---|---|---|---|
| Ico − Ifo < 0 | 0 | 0 | 0 | 0 |
| | | | | 1 |
| | | | 1 | 1 |
| | | | | 0 |
| | | 1 | 1 | 0 |
| | | | | 1 |
| | | | 0 | 1 |
| | | | | 0 |
| Ico − Ifo > 0 | 1 | 1 | 0 | 0 |
| | | | | 1 |
| | | | 1 | 1 |
| | | | | 0 |
| | | 0 | 1 | 0 |
| | | | | 1 |
| | | | 0 | 1 |
| | | | | 0 |
Fig. 8
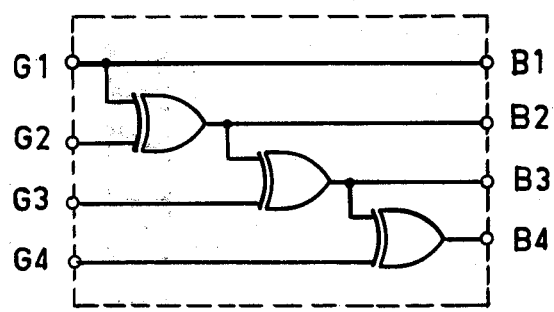
Fig. 9
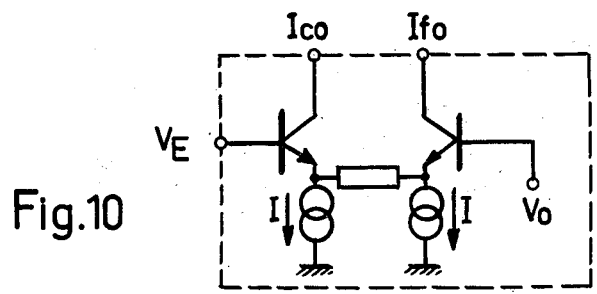
Fig. 10

BINARY ANALOG-DIGITAL CONVERTER

BACKGROUND OF THE INVENTION

1. Field of the Invention

The invention relates to a binary analog-digital converter, i.e. one which is capable of converting arbitrary analog quantities into digital signals expressed in a binary code.

The vast majority of physical quantities or parameters being currently examined are most frequently available in analog form. The use and processing of analog data, however, is difficult and subject to errors, drift or distortion. Furthermore, the signals representing these data are generally afflicted with noise, which may be difficult to eliminate. Therefore, it is preferred to use these data in digital form, because the processing of digital signals does not give rise to errors or drift and is less susceptible to noise and distortion.

2. Description of the Prior Art

In principle two types of converters are known which are capable of converting analog quantities into digital signals: the serial or successive-approximation converters, which employ one comparator per bit (or, if the conversion speed is not essential, a single comparator whose output is stored) and in which the digital signal is not available until after a certain number of clock cycles proportional to the number of bits (in fact, the complete settlement of a comparator should be awaited before proceeding to the next bit), and parallel converters which employ as many comparators as there are quantization steps (i.e. $2^n$ comparators in an n-bit converter) and which are also called asynchronous (instead of appearing only after a specific number of clock cycles, the digital signal closely follows the analog quantity to be transformed, obviously up to a certain frequency limit). The analog-digital converter which is the subject of the present Application belongs to this second category of asynchronous converters.

In an increasing number of industrial fields and in particular in that of television, automobiles, or other mass products employing electronics, it is essential to have analog-digital converters which are fast, have a low power consumption, which can be integrated and which are inexpensive. The slower serial converters cannot be used for such applications; the parallel converters, which are satisfactory in respect of the speed, have the drawback of a large number of components, so that they are complex and difficult to realize, which is rather costly.

SUMMARY OF THE INVENTION

Therefore, it is the object of the invention to propose a converter which combines said properties as regards speed, power consumption and simplicity.

To this end the invention relates to a binary analog-digital converter, which is characterized in that:

in the converter the analog quantity to be converted into a binary digital signal is represented by a current which lies between the minimum current and the maximum current that can be converted;

the converter in this order comprises an input stage, a number of conversion stages equal to the number n of digital-signal bits required, and an output stage, each of said (n+2) stages of the order 0, 1, 2, ..., i, ..., n−1, n, n+1 comprising two separate transmission channels, i.e. a comparison channel and a reference channel, all the comparison channels of the (n+2) stages being connected in series, all the reference channels of said (n+2) stages also being connected in series, and transition circuits being respectively included between the comparison channel of each conversion stage and that of the next stage and between the reference channel of each conversion stage and that of the next stage;

in the input stage the comparison channel is adapted to transfer an input current to the comparison channel of the next stage and the reference channel is adapted to transfer a reference current, which is equal to a fraction of the maximum current to the reference channel of the next stage, the difference between said input current and the reference current constituting a current which is representative of the analog quantity to be converted in a binary digital signal;

in each of the n conversion stages of the order 1, 2, 3, ..., i, ..., n−1, n, the comparison channel of the stage of the order i is adapted to transfer a comparison current which comprises at least the input current, to the comparison channel of the next stage, and the reference channel of said stage of the order i is adapted to transfer a reference current equal to a fraction of the maximum current to the reference channel of the next stage;

each of the n conversion stages of the order 1, 2, 3, ..., i, ... n−1, n comprises a comparator which, depending on the two possible results of a comparison between the two currents which are respectively transferred to the comparison and reference channels of the conversion stage of the order i by said channels of the preceding stage, is adapted to determine whether the logic level of the bit associated with said stage of the order i has one—or conversely the other—of the two values which said bit may assume and, by means of the two currents compared in the conversion stage of the order i and an auxiliary current, which is equal to a fraction of the maximum current and which is applied to said stage of the order i with the aid of a corresponding auxiliary current source, to switch such a current to the comparison and reference channels of the next stage that, if and only if one bit is left whose logic level has not yet been determined, the comparator of the following stage associated with said bit whose level is still undetermined can then compare the input current with the sum—or conversely with the difference—of the reference current applied to said conversion stage of the order i by the reference channel of the preceding stage and the auxiliary current applied to said stage of the order i by means of the corresponding auxiliary current source, said sum and said difference in all cases lying between the minimum current and the maximum current that can be converted, each comparison between the two currents being effected through a comparison between two voltages which are proportional to said currents and the current switching under control of the comparator being adapted to make the currents in the comparison and reference channels equal, even if there is no longer a bit whose logic level has not yet been determined;

in the output stage the comparison and reference channels are adapted to respectively receive the currents transferred by the comparison and reference channels of the last conversion stage of the order n+1.

Thus, in each of the consecutive conversion stages of said converter there are two possible current paths corresponding to the two positions of the comparator of said stage, i.e. for n consecutive stages n consecutive switching operations leading to $2^n$ combinations of positions of the n comparators of said stages. The $2^n$ current paths thus defined correspond to $2^n$ possible quantization levels, which thus permit the desired analog-digital conversion to be obtained with an accuracy which increases with the value of n. The currents are switched so as to approximate equality of the two currents passing through two channels of identical structure through a number of stages as small as the number of bits of the required digital signal.

The converter with all these characteristics is fast and asynchronous, for it operates in parallel and each comparison in a conversion stage can be effected before the comparator of the preceding stage has settled completely and the logic level of the bit associated with said preceding comparator has stabilized (i.e. without the use of a clock signal which defines a minimum time between consecutive conversions). Furthermore, owing to the current switching principle which has been adopted, the limited number of stages and their symmetrical structure and, the absence of input sampling this converter is extremely simple and has remarkable power consumption properties. This simplicity enables a particularly easy integration and the symmetry of the structure ensures an excellent automatic temperature compensation.

In a first embodiment the converter in accordance with the invention is characterized in that in accordance with either of the two possible results of the comparison between the reference current applied to the reference channel of said stage of the order i by that of the preceding stage and the current applied to the comparison channel of this same stage of the order i by that of the preceding stage, the comparator of each conversion stage of the order i is adapted to determined whether the logic level of the bit corresponding to said stage of the order i has the one, or conversely the other, of the two values which said level may assume, and to switch the auxiliary current which also corresponds to said stage of the order i to the comparison channel or, conversely, the reference channel of the following stage.

In a second embodiment the converter is characterized in that the comparator of each conversion stage of the order i, in accordance with one or the other of two possible results of the comparison between the reference current applied to the reference channel of said stage of the order i by that of the preceding stage and the current applied to the comparison channel of the same stage of the order i by that of the preceding stage, is adapted to determine whether the logic level of the bit corresponding to said stage of the order i has one or, conversely, the other of the two values which said level may assume, and to switch said reference current to the reference channel of the following stage and the sum of said current, applied to the comparison channel of said stage of the order i by that of the preceding stage, and the auxiliary current, which also corresponds to said stage of the order i, to the comparison channel of the following stage or, conversely, to switch the current applied to the comparison channel of said stage of the order i by the comparison channel of the preceding stage to the reference channel of the following stage and the sum of said reference current and said auxiliary current to the comparison channel of the following stage.

The use of these current switching methods enables a digital signal to be obtained at the output of the converter, which signal is expressed in a natural binary code in the first embodiment or in a reflected binary code (commonly referred to as Gray code) in the second embodiment. The bit associated with the first conversion stage indicates the sign of the difference between the input and the reference currents applied to the input stage of the converter. The bits associated with the other conversion stages serve to represent the result of the analog-digital conversion of this difference. The digital signals expressed in a natural binary code may be used directly by computers, but have the drawback that the logic levels of several bits may change simultaneously, which may give rise to a substantial error if one of the comparators corresponding to these bits is unsettled and in particular the comparator associated with the most significant bit. Conversely, for a digital signal expressed in the reflected binary code, a single bit changes its logic level when the analog input quantity of the converter changes by one quantization step; however, such a digital signal cannot be used directly in present computers. This illustrates the advantage of being able to choose the one or the other of said current switching methods for realizing the converter.

When the digital output signals of the converter are not expressed in the desired code, a code-modifying circuit may be included in said converter, which circuit is adapted to convert a signal expressed in the reflected binary code into a natural binary code, or the other way round.

In a particularly advantageous variant the converter may comprise a balancing circuit which enables such a reference current to be applied to the reference channel of the input stage that the sum of this current and the input current is constant. This arrangement, which employs complementary currents, leads to a reduction of the overall settling time of the converter and doubles the sensitivity of the comparators.

In an other variant of the converter, the reference current of the reference channel of the input stage is constant. In this case the converter always ensures the analog-digital conversion, with sign indication, of the difference between the input current and the reference current applied to the input stage. However, since the reference current is constant, it may also be stated that the converter assures the analog-digital conversion of the input current, because this current and its difference with the constant reference current are related to each other by a simple and obvious relation. The result of this conversion only depends on the values retained for determining the quantization levels of the analog quantity to be converted, i.e. values selected for the reference current of the input stage and for the auxiliary currents of the conversion stages.

A converter in accordance with the preceding embodiments may comprise a circuit for synchronizing the bits of the digital output signal, which is adapted to delay each individual bit of said signal so as to obtain a simultaneous read out of the combination of said bits when the logic level of each of them has been determined.

In an improved version the converter in accordance with the invention is characterized in that it comprises a memory circuit for storing, for the entire duration of the conversion, the current which represents the analog quantity to be converted into a digital signal, and a control circuit which is adapted to suppress the input and reference currents of the input stage and to instantaneously block the comparators in the position which they occupy, that the current representing the analog quantity to be converted is obtained by applying a voltage proportional to said quantity to the terminals of a resistor of a specific resistance value, and that the comparison and reference channels of the output stage of the converter each comprise a resistor whose resistance value is twice that of the resistor to whose terminals the voltage proportional to the analog quantity to be converted is applied.

These properties on the one hand enable a second converter to be arranged after the first one, so as to obtain the analog-digital conversion of the fraction of the analog quantity which has not been converted in the first converter (i.e. the residual fraction which is not quantized); however, such an arrangement can be realized only if the component parts have the same precision as that pursued by this cascade of converters. Said properties on the other hand enable inverse digital-analog conversion, by blocking the comparators in their positions and suppressing the input and reference currents of the input stage.

An interesting application of the converter in accordance with the invention is the realization of a converter of the modular type, comprising a first converter as defined in the foregoing and at least one second converter identical to the first one, of which the comparison channel of the input stage is adapted to handle the same current as the comparison channel of the input stage of the first converter, and of which the reference channel of the input stage is adapted to handle a reference current equal to the sum of the maximum current that can be converted by the first converter and the reference current through the reference channel of the input stage of said first converter. Such an arrangement enables the number of bits of the digital output signal to be increased.

Further features and advantages of the invention are illustrated by means of the following description and accompanying drawings, which by way of non-limitative example show several embodiments of the invention.

BRIEF DESCRIPTION OF THE DRAWING

FIG. 8 is the Table of output signals of the conversion stages for a converter using the conversion stage of FIG. 7 (at the output in the reflected binary code);

FIG. 9 shows a circuit for modifying the reflected binary code into a natural binary code;

FIG. 10 shows a balancing circuit which enables complementary currents to be obtained in the input stage;

DESCRIPTION OF THE PREFERRED EMBODIMENTS

Figure 1:
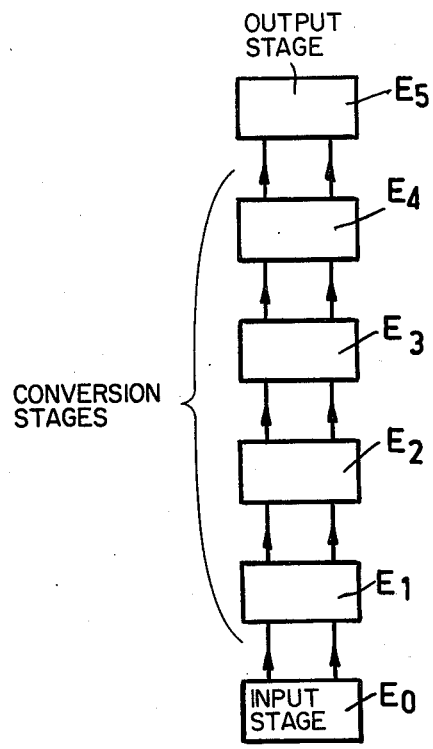
FIG. 1 is a highly simplified diagram of the converter in accordance with the invention, illustrating the principle of superposition of the various stages.
Figure 2:
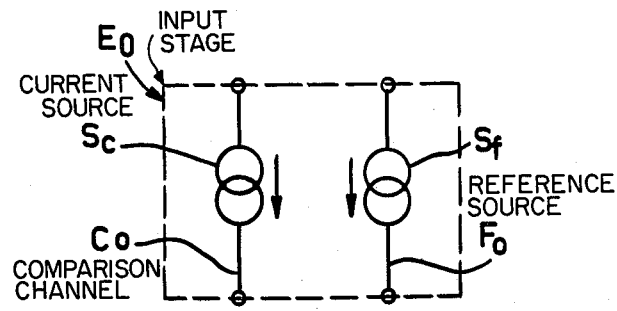
FIGS. 2, 3 and 4 show embodiments of the input stage, the first conversion stage (all the conversion stages being similar), and the output stage of the converter respectively, employing a bipolar technology and a conversion which yields a digital signal expressed in a natural binary code.
Figure 4:
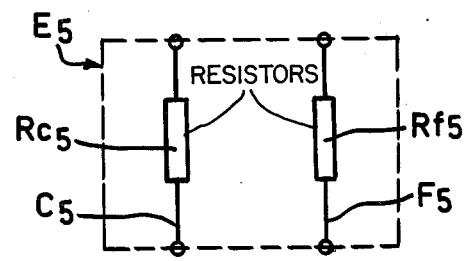
Figure 3:
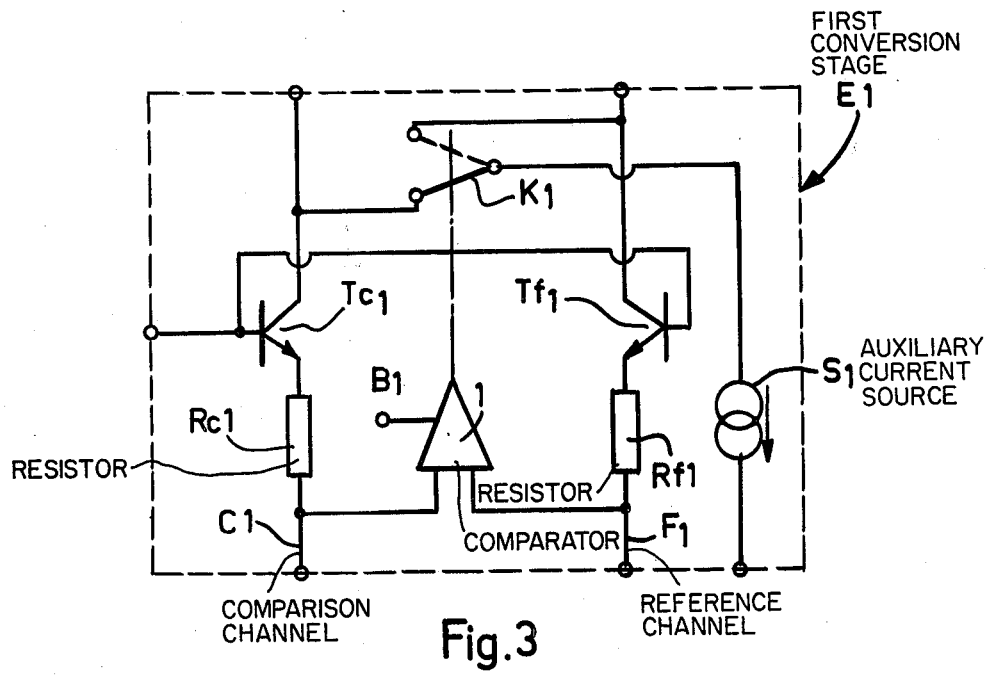

A binary analog-digital converter in accordance with the invention is described in detail hereinafter, referring first of all to FIGS. 1 to 6. For the sake of clarity and simplicity of the description and the accompanying Figures, this is limited to the case in which the digital signal supplied by the converter comprises four binary information elements or bits.

Thus, said converter in this order comprises an input stage Eo, four conversion stages E1 to E4, and an output stage E5, i.e. six stages for a 4-bit converter (an n-bit converter would comprise an assembly of n+2 consecutive stages). Each of these six stages of the order 0, 1, 2, 3, 4 and 5 comprises two separate transmission channels, designated comparison channel and reference channel. The stage Eo comprises a comparison channel Co and a reference channel Fo, the stage E1 a comparison channel C1 and a reference channel F1 etc., and the stage E5 a comparison channel C5 and a reference channel F5.

In the input stage $E_o$ (FIG. 2) the comparison channel $C_o$ comprises a current source Sc for transferring an input current Ico to the comparison channel C1 of the following stage (the conversion stage E1), and the reference channel Fo comprises a current source Sf for transferring a reference current Ifo to the reference channel F1 of the stage E1.

In the first conversion stage E1 (FIG. 3) the comparison channel C1 and the reference channel F1, which have an absolutely symmetrical structure, in this order, comprise a resistor (Rc1 and Rf1 respectively) and a transition circuit constituted by a transistor (Tc1 and Tf1 respectively). The resistors Rc1 and Rf1 have the same resistance values and the transistors Tc1 and Tf1 have been selected so that they have the same characteristics. The emitter of each transistor is connected to one of the terminals of the resistor, its collector is connected to the output of the transmission channel in which said transistor is included, and its base is adapted to be connected to a device for the generation of reference voltages (in the present example the bases of Tc1 and Tf1 are adapted to be connected to the same generation device). The two other terminals of the resistors Rc1 and Rf1 (those which are not connected to the emitters of the transistors Tc1 and Tf1) are respectively connected to the two inputs of a comparator 1.

Associated with said comparator 1 is an output terminal B1 on which one of the four bits which form the digital signal of the converter is present; for the sake of simplicity of the description the concise expression "bit B1" will be used in the rest of the description to designate the output terminal B1 and the logic level appearing on this terminal (low level "0" for the one position of the comparator, high level "1" for the other position). Associated with said comparator 1 is also a two-position switch K1. One of the terminals of said switch K1 is connected to the output of the comparison channel C1, the other is connected to the output of the reference channel F1, the common terminal being connected to an auxiliary current source S1. The position of the switch K1 is directly controlled by that of the comparator 1 and the position of the comparator 1 in its turn depends on the sign of the potential difference between the two inputs of said comparator.

The second, third and fourth conversion stages E2, E3 and E4 are absolutely identical to the stage E1, whose structure has just been described, and the elements in the stage E1 are also present in E2, E3 and E4, the index 1 being replaced by the appropriate index 2, 3 or 4. Therefore, these stages will not be described any further.

In the output stage E5 (FIG. 4) the comparison channel C5 comprises a resistor Rc5 and the reference channel F5 a resistor Rf5. The resistors Rc5 and Rf5 have the same resistance values.

Figure 5:
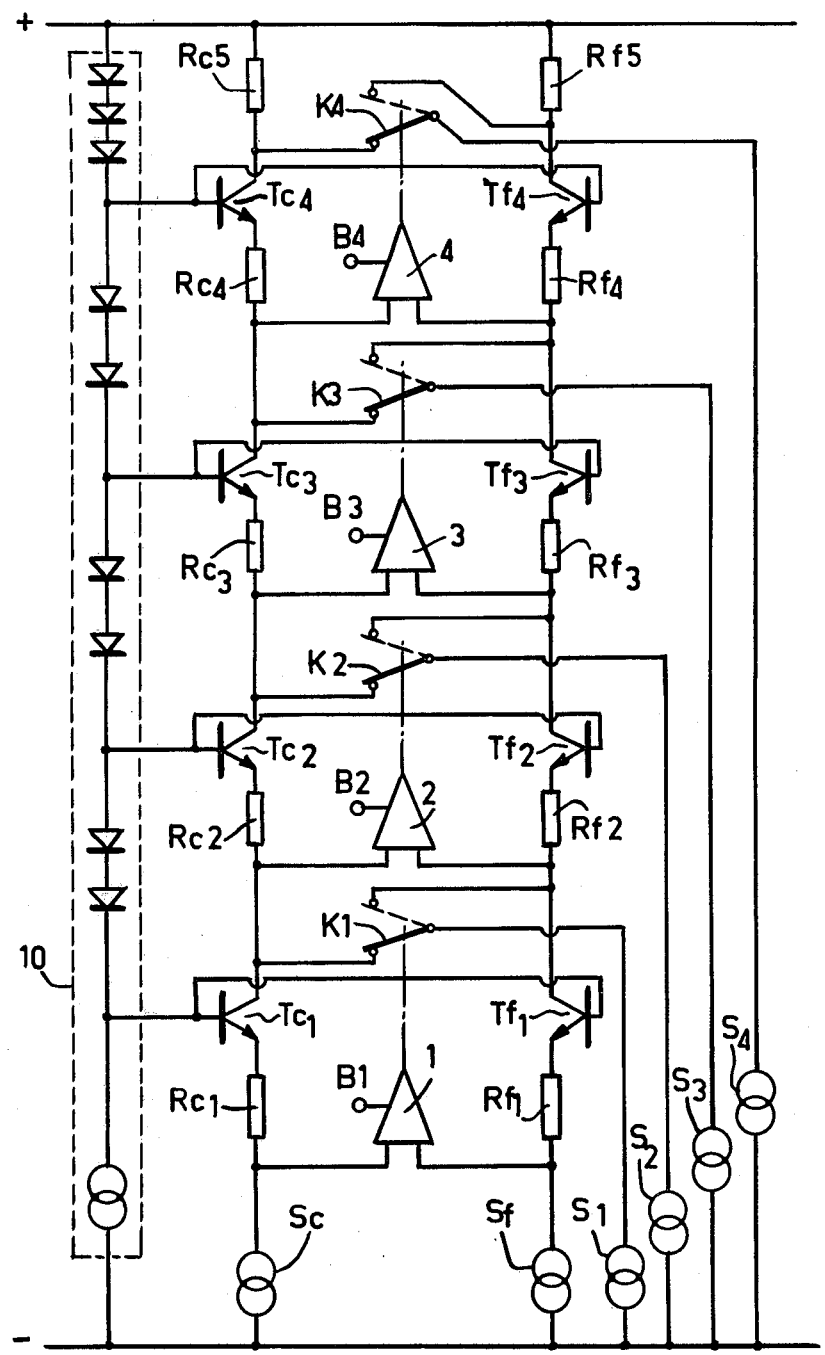
FIG. 5 in detail shows a complete version of a converter utilizing the stages shown in FIGS. 2 to 4.

Said stages Eo to E5 are again shown in FIG. 5, which represents the complete converter. The comparison channels of the six stages are connected in series, and so are the reference channels. The terminals of the input stage $E_o$ which are not connected to the stage E1 (the lower terminals in FIG. 2) are connected to the negative terminal of the power supply source of the converter. In each conversion stage E1 to E4 the terminal of the source S1, S2, S3 or S4 which is not connected to the switch K1, K2, K3 or K4 is connected to the negative power supply terminal. The terminal which is common to the two bases of the transistors of each conversion stage is connected to a specific terminal (which differs for each conversion stage) of the device 10 for generating the reference voltages, which device is constituted by a diode bridge and a current source connected in series between the positive and the negative terminals of the power supply. The terminals of the output stage E5 which are not connected to the last conversion stage E4 (upper terminals in FIG. 4) are connected to the positive terminal of the power supply.

Figures 6, 7:
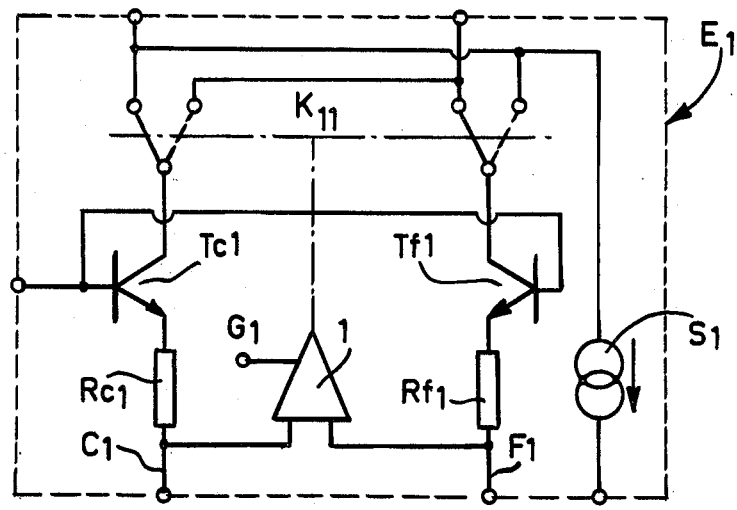
FIG. 6 is a Table listing the output signals of the conversion stages for the converter of FIG. 5 (at the output in the natural binary code)
FIG. 7 shows an embodiment of the conversion stages in the case of a conversion which yields a digital signal in the reflected binary code.

The operation of the converter whose structure has just been described is now explained with particular reference to FIGS. 5 and 6. Before describing this operation in detail it is to be noted that the signals appearing in the input stage of the converter are currents and that in the converter the analog quantity to be converted into a binary digital signal is thus represented by a current. This current lies between the minimum current Imin and the maximum current Imax that can be converted, if a correct analog-digital conversion is to be obtained. If this is not the case, it is assumed that this can be achieved by including an attenuation device, which does not form the subject of the present invention and which is not shown, after the converter.

Ico and Ifo are the two currents which flow in the comparison and reference channels Co and Fo of the input stage Eo and which are respectively fed into the comparison and reference channels C1 and F1 of the following stage E1 (the first conversion stage). Ix1, Ix2, Ix3 and Ix4 are the auxiliary currents which are respectively furnished by the auxiliary current sources S1 to S4. In the example chosen here, Ix1=Imax/2, Ix2=Imax/4, Ix3=Imax/8 and Ix4=Imax/16.

As the converter stages are strictly symmetrical (equal resistance values of the resistors Rc and Rf of the same stage; identical characteristics for the transistors Tc and Tf of the same stage and, in particular, equal VBE voltages of these transistors), it follows that the potential differences on the terminals of the comparators 1 to 4, i.e. Vc1-Vf1, Vc2-Vf2, Vc3-Vf3, Vc4-Vf4 respectively cancel each other if the two currents which enter the corresponding conversion stage are equal. The comparator 1 thus compares Ico and Ifo when it compares the voltages Vc1 and Vf1. If Ico is smaller than Ifo, the logic level of bit 1 remains low ("0" level by convention) and the switch K1 occupies its lower position (that shown by a continuous line in FIGS. 3 and 5); conversely, if Ico is greater than Ifo, the logic level of bit B1 becomes high ("1" level by convention), the switch K1 changes over (at the same time as the comparator 1) to the position shown by dashed lines in FIGS. 3 and 5, and the auxiliary current Ix1=Imax/2 through the comparison channel C1 of the conversion stage E1 ceases and is applied to the reference channel F1 of the same stage.

Consequently, if B1=0, the comparator 2 of the conversion stage E2 will compare (Ico+Imax/2) and Ifo or, which is equivalent, (Ifo−Ico) and Imax/2: if (Ico+Imax/2) is smaller than Ifo or, which is equivalent, if (Ico−Ifo) is smaller than Imax/2, the logic level of bit B2 remains low ("0" level) and the switch K2 occupies its lower position (defined in the same way as for the switch K1), while conversely, if (Ico+Imax/2) is greater than Ifo or, which is equivalent, if (Ico−Ifo) is greater than Imax/2, the logic level of the bit B2 becomes high ("1" level), the switch K2 changes over (at the same time as the comparator 2) to its upper position, and the auxiliary current Ix2=Imax/4 through the comparison channel C2 of the conversion stage E2 ceases and is fed into the reference channel F2 of the same stage. However, if B1=1, the comparator 2 of the conversion stage E2 will compare Ico and (Ifo+Imax/2) or, which is equivalent (Ifo−Ico) and Imax/2: if Ico is smaller than (Ifo+Imax/2) or, which is equivalent, if (Ico−Ifo) is smaller than Imax/2, the logic level of bit B2 remains low ("0" level) and switch K2 occupies its lower position, whilst conversely, if Ico is greater than (Ifo+Imax/2) or, which is equivalent, if (Ico−Ifo) is greater than Imax/2, the logic level of the bit becomes high ("1" level), the switch K2 changes over (at the same time as the comparator 2) to its upper position, and the auxiliary current Ix2=Imax/4 through the comparison channel C2 of the conversion stage E2 ceases and is fed into the reference channel F2 of said stage.

If B1=0 and B2=0, the comparator 3 of the conversion stage E3 will compare (Ico+Imax/2+Imax/4) and Ifo or, which is equivalent (Ifo−Ico) and (Imax/2+Imax/4). If B1=0 and B2=1, the comparator 3 will compare (Ico+Imax/2) and (Ifo+Imax/4), or which is equivalent (Ifo−Ico) and (Imax/2−Imax/4). If B1=1, and B2=0, the comparator 3 will compare (Ico+Imax/4) and (Ifo+Imax/2), or which is equivalent, (Ico−Ifo) and (Imax/2)−(IMax/4). If finally B1=1 and B2=1, comparator 3 will compare Ico and (Ifo+Imax/2+Imax/4) or, which is equivalent, (Ico−Ifo) and (Imax/2+Imax/4).

In accordance with the foregoing it follows that the logic level of B1 is 0 or 1 depending on the sign of Ico−Ifo, and that the logic level of B2 is 0 or 1 depending on whether (Ico−Ifo) has an absolute value smaller or greater than Imax/2. The bit B1 of the conversion stage E1 thus serves to indicate the sign of the difference (Ico−Ifo) and, irrespective of the sign, the bit B2 of the conversion stage E2 indicates the result of the comparison between (Ico−Ifo) or (Ifo−Ico), whichever applies, and the current Imax/2. If this difference is smaller than Imax/2, the bit B3 of the conversion stage E3 indicates the result of the comparison between said difference and (Imax/2−Imax/4)=Imax/4. Conversely, if said difference is greater than Imax/2, the bit B3 indicates the result of the comparison between said difference and (Imax+Imax/4)=3 Imax/4.

The behavior of the fourth and last conversion stage E4 with respect to the stage E3 is the same as that of the stage E3 with respect to the stage E2. Irrespective of the two possible paths in respect of the switching operation in each of the conversion stages E1, E2 and E3, the fourth conversion stage E4 also has two switching possibilities in conformity with the relative values of the two currents applied to its comparison channel C4 and reference channel F4 by the comparison channel C3 and the reference channel F3 of the preceding stage. Depending on whether one of these two currents is smaller or greater than the other, the comparator 4 will change over or not; depending on the position of the comparator 4, the logic level of the bit B4 will be 0 or 1, and the switch K4 will change over or not (at the same time as the switch 4), which in a similar way as for the currents Ix1, Ix2 and Ix3 determines the application of the auxiliary current Ix4 supplied by the auxiliary source S4.

The different logic levels which may be assumed by the bits B1 to B4 as function of the sign of the difference (Ico−Ifo) and of its value may be listed in a Table such as that shown in FIG. 6. When reading this table it is immediately apparent that the digital signal constituted by the signal B1 B2 B3 B4 is the result of the analog-digital conversion of (Ico−Ifo) in a natural binary code, B1 indicating the sign of said difference and the bits B2 to B4 its digital value with the selected quantization.

Thus the converter in accordance with the invention, which has been described in detail, employs a "differential" principle, for the analog quantity which is actually converted into a digital signal by the converter is only the difference between the two analog values (in this case two currents) applied to the input stage of said converter, said difference being expressed, after conversion, in the form of a digital signal with three bits plus one sign bit in the present example.

The description of the structure and the operation of the converter remains identical for an n-bit converter. The digital signal supplied is the result of the analog-digital conversion of the difference between the two analog quantities (in this case two currents) applied to the input stage, said difference being expressed in the form of a digital signal with $(n-1)$ bits plus one bit B1 indicating the sign of said difference.

The principle advantages of the converter in accordance with the invention will be apparent from the foregoing description and are summarized hereinafter.

This converter is fast. Indeed, when the position of the comparator 1 has been established by comparison of the input current Ico and the reference current Ifo through the input stage Eo, the comparator 2 of the conversion stage E2 may become operative. This is the same for the following stages. Owing to the parallel operation of the four successive conversion stages, it is not necessary that the comparator of one stage await the complete settlement of the comparators of the preceding stages. The comparators 1 to 4 operate as closely as possible after each other. Experiments have revealed that a conversion time smaller than 30 nanoseconds can be obtained for a four-bit converter using a known bipolar technology.

This converter is just as simple in respect of its construction as in respect of its operation. The simplicity of this structure (symmetry of all the stages) and operation (consecutive switching to two positions, tending to make the two currents which proceed from stage to stage equal) and the limited number of conversion stages (since said asynchronous converter employs only a single comparator per bit, in contradistinction to prior-art designs which for a rapid conversion require $2^n$ comparators to obtain an n-bit digital signal) result in a particularly economic construction and manufacture. This advantage is of prime importance in the case of the applications envisaged in the foregoing (television, automobiles, etc . . . ).

Finally experiments have revealed that the consumption of this converter remains low. For example the power consumed by a 6-bit converter is of the order of 150 milliwatts.

In the embodiment described with reference to FIGS. 7 and 8, the conversion stages E1 to E4 respectively comprise switches K11 to K14 which are adapted to obtain current switching of a type other than that possible with the switches K1 to K4. FIG. 7 shows the conversion stage E1 provided with the switch K11; the elements other than said switch are identical to those in the first embodiment of the stage E1 and bear the same references.

The operation of the converter thus modified is as follows. As in the foregoing, the logic level of the bit G1 is low or high (0 or 1) depending on whether Ico is smaller or greater than Ifo. If G1=0, the switch K11 of the conversion stage E1 is in the position represented by a continuous line in FIG. 7; the auxiliary current Ix1 supplied by the source S1 is fed into the channel in which the smallest current flows. Conversely, if G1=1, the switch K11 changes over (at the same time the comparator 1) to the position represented by dashed lines in FIG. 7, so that the currents Ico and Ifo and thus the comparison and the reference channels are permuted (only from the moment at which said switch K1 is released by Ico and Ifo); in this case the auxiliary current Ix1 is fed to the channel in which the smallest current flows.

Consequently, if G1=0, the comparator 2 of the conversion stage E2 will compare (Ico+Imax/2), transferred to the comparison channel C2 of the stage E2, and Ifo, transferred to the reference channel F2 of the stage E2. If G1=1, the comparator 2 will compare Ico, applied to the reference channel of the stage E2, and (Ifo+Imax/2), applied to the comparison channel of the stage E2. The transition of G1 from the logic level 0 to the logic level 1 and the resulting permutation of the currents by the simultaneous change-over of the switch K11 occur at the instant at which these currents are equal. At this instant, allowance being made for the fact that the auxiliary currents Ix1 to Ix4 are systematically applied from the same side of the converter (left-hand channels in Figure), it is impossible that the currents can be equal for a comparator other than the comparator 1, for the auxiliary currents are all added to one of the equal currents appearing on the inputs of the comparator 1. Thus, in the case of indecision of the comparator 1 (owing to the fact that Ico=Ifo), it is ensured that no other comparator can be unsettled, because none of them can change over at the instant at which the comparator 1 changes over. For the same reason the currents appearing on its inputs at the instant at which the comparator 2 changes over and those appearing on the inputs of the comparators 3 and 4 cannot be equal. The same applies to the comparator 4, which cannot change over at the instant at which the comparator 3 changes over. In brief, a single comparator may be in an unsettled state, the positions of the three other comparators at the same instant being defined unambiguously.

The characteristic feature of the reflected binary code or Gray code is now apparent; the logic levels of G1 to G4 are expressed in this code and are indicated in the Table of FIG. 8 (to be compared with the Table of FIG. 6, which corresponds to the natural binary code). As in the foregoing, G1 represents the sign of the difference (Ico-Ifo) and G2 to G4 the digital value of said difference, taking into account the selected quantization.

With the first method of current switching, the digital output signal of the converter is expressed in a natural binary code and may be used directly in a computer, but a series of unsettled situations may occur (in particular if Ico and Ifo are equal or approximate each other very closely). It is then possible to adopt the second current-switching method and to include a code modifying circuit in the converter which is adapted to convert the digital signal G1G2G3G4 expressed in the reflected binary code into a digital signal expressed in the natural binary code. Such a circuit is shown in FIG. 9.

Conversely, if the converter is adapted to supply a digital signal expressed in the natural binary code and for whatever reason a signal in the reflective binary code is required, a code-modifying circuit adapted to effect this conversion may be included, as in the foregoing.

Two major advantages of a converter which supplies a digital output signal in the reflected binary code will now become apparent: on the one hand, the rate of variation of the logic level of the least significant bit is twice as small than with the natural binary code, which becomes obvious when comparing the Tables of FIGS. 6 and 8 so that the value of the frequency limit at which the converter can operate is doubled and, on the other hand, the currents to be switched in each conversion stage become increasingly larger on their way through the stages, so that they are switched more rapidly as they proceed towards the output stage.

In a variant the converter may comprise a balancing circuit which enables a complementary current to be fed to the reference channel Fo of the input stage Eo, this current being complementary of current applied to the comparison channel Co of said stage. This arrangement reduces the settling time of the converter and doubles the sensitivity of the comparators. An example of the balancing circuit is shown in FIG. 10, where VE is a voltage which is proportional to the analog quantity to be converted into a binary digital signal and Ic and Ifo are the currents applied to the channels Co and Fo of the input stage Eo of the converter. As Ifo and Ico are complementary, the following expression is valid:

$$Ico + Ifo = k \; (k = \text{constant})$$

$$Ifo = k - Ico$$

$$(Ico - Ifo) = Ico - (k - Ico)$$

$$(Ico - Ifo) = 2.Ico - k \quad (1)$$

$$\text{or: } Ico = \frac{(Ico - Ifo) + k}{2} \quad (2)$$

which means that the analog quantity converted by the converter, (Ico−Ifo), and the current Ico are directly linked to each other by a functional relation which may be represented by expression (1) or by expression (2). Thus, the converter still employs the differential principle, but is now adapted to receive only a single analog quantity.

In a further variant the reference current of the reference channel Fo of the input stage Eo is constant. This constant value Ifo=Ixo is for example equal to Imax/2, and the currents Ix1 to Ix4 assume values which are respectively equal to Imax/4, Imax/8, Imax/16 and Imax/32. In this case, if Ico is smaller than Ixo=Imax2, B1=0 and if Ico is greater than Ixo=Imax/2, B1=1. If B1=0, the comparator 2 will compare (Ico+Imax/4) and Imax/2, or, which is equivalent, Ico and (Imax/2−Imax/4)=Imax/4. Conversely, if B1=1, the comparator 2 will compare Ico and (Imax/2+Imax/4)=3 Imax/4. The reasoning is the same for the comparator 3 and for the comparator 4, which compare currents of different values in conformity with the logic levels of the bits of the preceding conversion stages. In the variant described here, the converter is adapted to effect the conversion of the current Ico (representing the analog value to be converted) into a four-bit binary digital signal (in this case without sign bit), the quantization step adopted for the conversion being equal to Imax/16 (whereas it was only equal to Imax/8 in the case of the differential converter, owing to the presence of a sign bit among an equal total number of bits). As in the foregoing, the digital output signal of the converter is expressed in the natural or reflected binary code depending on the current switching method used in the conversion stages.

In all the embodiments described in the foregoing the logic levels assumed by the bits are determined at different instants, the bit B1 (or G1) appearing first, the bit B2 (or G2) second, the bit B3 (or G3) third, and the least significant bit B4 (or G4) last. In most applications envisaged for the converter in accordance with the invention a simultaneous read-out or use of the four bits (generally speaking of n bits) is necessary. The converter then comprises a circuit for synchronizing the bits of the digital output signal. This circuit is adapted to delay each of the four bits by a time t1, t2, t3 and t4 respectively. In the case of applications where the conversion result should be known or used as rapidly as possible, t4=0 is chosen, i.e. the read out (or use) of the bits B1 to B3 (G1 to G3) is adapted to that of the least-significant bit which is known last, i.e. to that of B4 (or Bn for an n-bit converter), or G4.

In an improved embodiment the converter in accordance with the invention has the following characteristic features:

(a) it comprises a memory circuit (for example a sample-and-hold circuit connected to the input of the converter) which is adapted to store the current representing the analog quantity to be converted into a digital signal for the entire duration of the conversion;

(b) it also comprises a control circuit (or clock circuit) which is adapted to suppress the input and reference currents of the input stage and to block the comparators instantaneously in the position which they occupy at a specific instant;

(c) the current representing the analog quantity to be converted is obtained by applying a voltage proportional to said quantity to the terminals of a resistor Rs with a specific resistance value (i.e. Rs=Vmax/Imax, Vmax and Imax being the full-scale voltage and current of the converter, which obviously cannot garantee the correct conversion of the analogue quantities corresponding to a current greater than Imax);

(d) the comparison and reference channels C5 and F5 of the last stage E5 of the converter each comprise a resistor whose resistance value is 2×Rs.

Once the converter has thus been realized, calculations made by choosing an arbitrary value for the input current within the conversion range demonstrate that if the comparators (and thus the current switching operations) are blocked and the currents of the input stage are suppressed with the aid of the control circuit, the value of the current which is representative of the analog quantity to be converted is available across the terminals of one of said resistors of the stage E5 and the full-scale complement of the same current is available across the terminals of the other resistor of the stage E5. These two indications suffice to determine the value of said current, which means that for a specific value of the digital signal B1 B2 B3 B4 (or G1 G2 G3 G4) the converter is capable of effecting the digital-analog conversion of said signal.

A further advantage of this improved embodiment of the converter is as follows. Owing to the memory circuit, which preserves the initial analog signal, the difference may be formed between said initial signal and the analog signal which is restored as described in the foregoing. After suitable processing, this difference is used as input signal for a second analog-digital converter. This last-mentioned converter converts said difference with a number of bits which may differ from that of the first converter.

Figure 11:
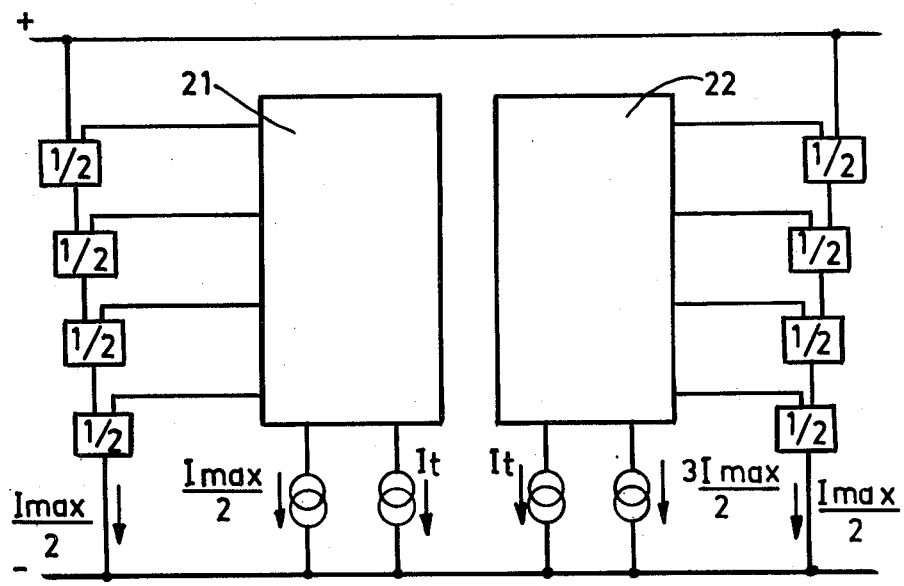
FIGS. 11 and 12 respectively show an example of a modular converter with (n+1) bits and a diagram which illustrates the operation of this modulator converter.
Figure 12:
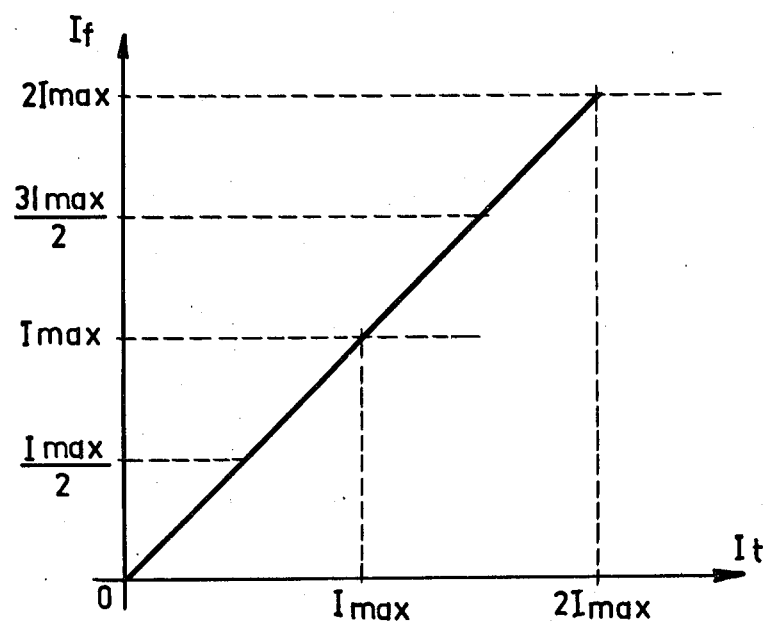

Equally, by using a plurality of converters and by suitably proportioning the reference currents of the respective input stages, a modular converter with a higher number of bits may be realized. FIGS. 11 and 12 correspond to an example of a modular converter with 5 bits, comprising two 4-bit converters 21 and 22. FIG. 11 shows that the reference current of the input stage of the converter 21 is equal to Imax/2, and that of the input stage of the converter 22 is equal to 3Imax/2. Thus, as follows from FIG. 12 which shows the variations, which are possible within the conversion range of the modular converter, of the signal It to be converted, if said signal It is smaller than Imax, the 4-bit converter 21 effects its conversion, the total digital signal supplied being equal to B1 B2 B3 B4 B5, where B1=0 and B2 B3 B4 B5 being supplied by the converter 21; conversely if the signal to be converted is greater than Imax, the converter 22, which also has 4 bits, effects said conversion, the total digital signal supplied by modular converter being B1 B2 B3 B4 B5, with B1=1 and B2 B3 B4 B5 being supplied by the converter 22. The auxiliary currents applied to the converters 21 and 22 are for example Imax/2, Imax/4, Imax/8 etc as described in the previous embodiment, but they may also have different values corresponding to a different geometrical progression or even a progression of a different type, for example logarithmic.

As appears from the foregoing, the comparators may remain unsettled for certain values of the currents appearing on their inputs. Circuits for approximation by deficiency or, conversely, by excess, of the logic level of each bit may be associated with each comparator in order to eliminate this risk of indecision.

All the preceding Figures show embodiments of the converter employing a bipolar technology. However, this choice does not constitute a limitation, the principle of the converter and its operation being the same when other technologies are employed. In the embodiments described the operation is even improved if the symmetrical elements of the various stages, in particular the transistors, are matched.

It is evident that the present invention is not limited to the embodiments which have been described and shown, from which embodiments other methods and embodiments may be derived without departing from the scope of the invention.

For example, in the Figures the comparator of each conversion stage and the associated switch have been represented schematically. The comparison and current-switching functions may also be realized with the aid of comparison and switching circuits employing transistors and resistors, in which the resistance values of the resistors may be adjusted so as to prevent saturation of the transistors and so as to increase the current-switching speed.

Furthermore, when describing the structure of the converter shown in FIG. 5, it has been stated that the terminal of the source S1, S2, S3 or S4 that is not connected to the switch K1, K2, K3 or K4 is connected to the negative terminal of the power supply. In contradistinction thereto, in a variant said terminal may be connected to the positive terminal of the power supply. For each conversion stage this results in a subtraction of the currents instead of an addition. The maximum current which may flow through the resistors of the channels of each conversion stage thus decreases through these stages. In order to obtain the same maximum voltage drop across said resistors, it is then possible to increase their resistance values. Thus, the potential difference across the comparators is increased at the same difference of the signal current with the transition current of one quantization step, which leads to an improved sensitivity of the comparators.

Finally, it is to be noted that a converter has been described which utilizes a bipolar technology, but that this example is non-limitative and that other technologies may be used. In particular in each channel of each conversion stage the assembly comprising the transistor Tc or Tf and the resistor Rc or Rf connected to the respective emitter may be replaced by a MOS-transistor.

What is claimed is:

1. A binary analog-digital converter in which the analog quantity to be converted into a binary digital signal is represented by a current which lies between the minimum current and the maximum current that can be converted comprising:

an input stage;
a number of conversion stages equal to the number of n digital-signal bits required; and
an output stage;
each of said (n+2) stages of the order 0, 1, 2, . . . , i, . . . n−1, n, n+1 comprising two separate transmission channels, i.e. a comparison channel and a reference channel, all the comparison channels of the (n+2) stages being connected in series, all the reference channels of said (n+2) stages also being connected in series;
transition circuits being included between the comparison channel of each conversion stage and that of the next stage and between the reference channel of each conversion stage and that of the next stage;
the comparison channel of the input stage being adapted to transfer an input current to the comparison channel of the next stage and the reference channel being of the input stage adapted to transfer a reference current, which is equal to a fraction of the maximum current, to the reference channel of the next stage, the difference between said input current and the reference current constituting a current which is representative of the analog quantity to be converted into a binary digital signal;

in each of the n conversion stages of the order 1, 2, 3, ..., i, ..., n−1, n, the comparison channel of the stage of the order i being adapted to transfer a comparison current, which comprises at least the input current, to the comparison channel of the following stage, and the reference channel of said stage of the order i being adapted to transfer a reference current equal to a fraction of the maximum current to the reference channel of the next stage;

each of the n conversion stages of the order 1, 2, 3, ..., i, ..., n−1, n, comprising a comparator which, depending on the two possible results of a comparison between the two currents which are respectively applied to the comparison and refernce channels of the conversion stage of the order i by said channels of the preceding stage, is adapted to determine whether the logic level of the bit associated with said stage of the order i has one, or conversely the other, of the two values which said bit may assume and by means of the two currents compared in the conversion stage of the order i and an auxiliary current which is equal to a fraction of the maximum current and which is applied to said stage of the order i with the aid of a corresponding auxiliary current source, to switch such a current to the comparison and reference channels of the next stage that, if and only if one bit is left whose logic level has not yet been determined, the comparator of the following stage corresponding to said bit whose level is still undetermined can then compare the input current with the sum, or conversely the difference, of the reference current applied to said conversion stage of the order i by the reference channel of the preceding stage and the auxiliary current applied to said stage of the order i with the aid of the corresponding auxiliary current source, said sum and said difference in all cases lying between the minimum current and the maximum current that can be converted, each comparison between two currents being effected by a comparison between two voltages which are proportional to said currents, and the current switching under control of the comparator being adapted to make the currents in the comparison and reference channels equal, even if there is no longer a bit whose logic level has not yet been determined;

in the output stage the comparison and reference channels are adapted to respectively receive the currents which are transferred by the comparison and reference channels of the last conversion stage of the order n;

each comparison between two voltages being realized by a comparison between potential difference across two equal resistors which are each included in one channel of each conversion stage;

depending on the two possible results of the comparison between the reference current applied to the reference channel of said stage of the order i by that of the preceding stage and the current applied to the comparison stage of the same stage of the order i by that of the preceding stage, the comparator of each conversion stage of the order is adapted to determine whether the logic level of the bit corresponding to said stage of the order i has the one, or conversely the other, of the two values which said level may assume, and to switch the auxiliary current which also corresponds to said stage of the order i to the comparison channel or, conversely, the reference channel of the following stage; and the comparator of each conversion stage of the order i, in accordance with one or the other of the two possible results of the comparison between the reference current applied to the reference channel of said stages of the order i by that of the preceding stage and the current applied to the comparison channel of said stage of the order i by that of the preceding stage, is adapted to determine whether the logic level of the bit corresponding to said stage of the order i has the one or, converely, the other of the two values which said level may assume, and to switch said reference current to the reference channel of the following stage and the sum of said current, applied to the comparison channel of said stage of the order i by that of the preceding stage, and the auxiliary current, which also corresponds to said stage of the order i, to the comparison channel of the following stage, or, conversely, to switch the current applied to the comparison channel of said stage of the order i by the comparison channel of the preceding stage to the reference channel of the following stage and the sum of said reference current and the auxiliary current to the comparison channel of the following stage.

2. A converter as claimed in claim 1, characterized in that it includes a code-modifying circuit adapted to convert a digital signal expressed in a natural binary code into an n-bit digital signal expressed in a reflected binary code.

3. A converter as claimed in claim 1, characterized in that it includes a code-modifying circuit which is adapted to convert a digital signal expressed in a reflected binary code into an n-bit digital signal expressed in a natural binary code.

4. A converter as claimed in claim 1, characterized in that it includes a balancing circuit which enables such a reference current to be applied to the reference channel of the input stage that the sum of said current and the input current is constant.

5. A converter as claimed in claim 1, characterized in that the auxiliary current applied to the first conversion stage is equal to half the maximum current that can be converted and that the auxiliary current applied to each of the conversion stages other than the first stage is equal to half the auxiliary current applied to the conversion stage preceding it.

6. A converter as claimed in claim 1, characterized in that the reference current in the reference channel of the input stage is constant.

7. A converter as claimed in claim 6, characterized in that the reference current through the reference channel of the input stage is equal to half the maximum current that can be converted, that the auxiliary current applied to the first conversion stage is equal to half said reference current, and that the auxiliary current applied to each conversion stage is equal to half the auxiliary current applied to the conversion stage preceding it.

8. A converter as claimed in claim 1, characterized in that it includes a circuit for synchronizing the bits of the digital output signal, which is adapted to delay each individual bit of said signal.

9. A converter as claimed in claim 1, characterized in that it includes a memory circuit for storing, for the entire duration of the conversion, the current which represents the analog quantity to be converted into a digital signal, and a control circuit which is adapted to suppress the input and reference currents of the input stage and to instantaneously block the comparators in the positions which they occupy, that the current representing the analog quantity to be converted is obtained by applying a voltage proportional to said quantity to the terminals of a resistor of a specific resistance value, and that the comparison and reference channels of the output stage of the converter each comprise a resistor whose resistance value is twice that of the resistor to whose terminals the voltage proportional to the analog quantity to be converted is applied.

10. A converter as claimed in claim 1, characterized in that it includes circuits for approximation by deficiency of the logic level of each bit, respectively associated with each comparator.

11. A converter as claimed in claim 1, characterized in that it comprises circuits for approximation by excess of the logic level of each bit, respectively associated with each comparator.

12. A converter as claimed in claim 1, characterized in that the transition circuits included between the corresponding channels of each conversion stage and the next stage are semiconductor elements with three electrodes, of which the two main electrodes are connected to the output of a channel of the relevant conversion stage and to the input of the corresponding channel of the next stage respectively, and of which the control electrode is connected to a respective terminal of a reference-voltage generation device.

13. A converter as claimed in claim 1, characterized in that all the components are symmetrically arranged in each of the comparison and reference channels of each stage of said converter are matched.

14. A binary analog-digital converter of the modular type, comprising a first converter as claimed in claim 5, characterized in that it comprises at least a second converter identical to the first one, of which the comparison channel of the input stage is adapted to handle the same current as the comparison channel of the input stage of the first converter, and of which the reference channel of the input stage is adapted to handle a reference current equal to the sum of the maximum current that can be converted by the first converter and the reference current through the reference channel of the input stage of said first converter.

* * * * *